United States Patent [19]
Saitoh

[11] 4,372,030
[45] Feb. 8, 1983

[54] METHOD FOR PRODUCING A SEMICONDUCTOR DEVICE

[75] Inventor: Shinji Saitoh, Yokohama, Japan

[73] Assignee: Vlsi Technology Research Association, Japan

[21] Appl. No.: 208,395

[22] Filed: Nov. 19, 1980

[30] Foreign Application Priority Data

Nov. 21, 1979 [JP] Japan .............................. 54/150977

[51] Int. Cl.³ .......................................... H01L 21/26
[52] U.S. Cl. ................................ 29/569 R; 29/576 B; 29/576 W; 29/580; 148/175; 148/187; 357/34
[58] Field of Search ............ 29/569 R, 576 B, 576 W, 29/589, 590, 591, 580; 148/1.5, 187, 175; 357/34

[56] References Cited

U.S. PATENT DOCUMENTS

| | | | |
|---|---|---|---|
| 3,911,471 | 10/1975 | Kooi et al. | 148/175 X |
| 3,928,091 | 12/1975 | Tachi et al. | 148/175 |
| 3,961,356 | 6/1976 | Kooi | 357/50 |
| 3,992,232 | 11/1976 | Kaiji et al. | 148/175 |
| 3,993,513 | 11/1976 | O'Brien | 148/175 |
| 4,140,558 | 2/1979 | Murphy et al. | 148/175 |
| 4,283,236 | 8/1981 | Sirsi | 148/175 X |

OTHER PUBLICATIONS

NEUES AUS DER TECHNIK, Dec. 1, 1976 pg. 1.
European Search Report, dated Dec. 17, 1981, in application No. EP 80 107029

Primary Examiner—G. Ozaki
Attorney, Agent, or Firm—Finnegan, Henderson, Farabow, Garrett & Dunner

[57] ABSTRACT

A method for producing a semiconductor device comprises the steps of selectively etching a part of a second conductivity type semiconductor layer formed on a first conductivity type semiconductor substrate where an isolating oxide layer is to be formed; introducing a first conductivity type impurity into a substrate contact forming part extending from the bottom of said etched part, by way of the side surface thereof, to the top surface of said second conductivity type semiconductor layer to form a substrate contact; thermally oxidizing said etched part to form an isolating oxide layer and forming a semiconductor element in said second conductivity type semiconductor layer.

8 Claims, 12 Drawing Figures

METHOD FOR PRODUCING A SEMICONDUCTOR DEVICE

The present invention relates to a method for producing a semiconductor device and, more particularly, to an improvement in a method for forming a substrate bias terminal of a semiconductor device which is element-isolated by an oxide layer.

A reverse bias is applied to a substrate in a semiconductor integrated circuit for improving the operation of the circuit. In this case, the substrate potential is kept at the minimum potential for a p-type substrate and at the maximum potential for an n-type substrate so that the p-n junction of the element region and the substrate becomes biased in the reverse direction.

Conventional methods for forming a substrate bias terminal for a semiconductor device are known, such as a method for forming at the underside of the substrate an electrode to which is applied an external potential, and a method for forming a contact as a substrate bias terminal in the isolating region in the case of p-n junction isolation.

As an oxide layer isolation technique for a semiconductor device, methods are adopted such as a method for completely isolating the element region with an oxide layer, and a method for isolating the element region with an oxide layer in cooperation with a diffused isolating region formed thereunder for preventing the inversion, the latter method especially for effecting element isolation of the thick epitaxial layer in a bipolar transistor. In a semiconductor device in which element isolation is accomplished with the latter isolation technique, an electrode is generally formed on the underside of the substrate as a substrate bias terminal. However, with such a method for supplying a bias from the underside of the substrate, the substrate resistance becomes high when the impurity concentration of the substrate is low. Thus, when such a substrate is adopted in a semiconductor integrated circuit having a substrate pnp transistor, the high resistance is connected in series with the elements so that the characteristics of the device are extremely degraded.

As a measure to eliminate these problems, it has been proposed to form a substrate bias terminal by a method as shown in FIGS. 1A and 1B. Thus, as shown in FIG. 1A, an n-type epitaxial layer 2 formed on a p-type silicon substrate 1 is isolated by a p+-type diffusion isolating region 3 and an isolating oxide layer 4a. At the same time, an isolating oxide layer 4b for forming a bias terminal is formed inside the isolated island element region 5. Subsequently, as shown in FIG. 1B, in the part of the element region 5 surrounded by the isolating oxide layer 4b is diffused or ion implanted and thermally diffused a p+-type impurity to a high concentration to form a p+-type substrate contact region 6, and a substrate bias terminal is formed by connecting an electrode to the region 6. When the substrate bias terminal is formed by such a method, a reverse bias may be applied to the substrate without degrading the characteristics of the device even when the p-type silicon substrate 1 has a low impurity concentration.

However, with such a substrate bias terminal forming method, a step of diffusing or ion implanting and thermally diffusing for a long time an impurity to a high concentration is necessary for forming a substrate contact in addition to the steps of forming the diffusion isolating region and the isolating oxide layer. This inconveniently increases the number of steps. Further, since it is necessary to form an oxide layer and the high concentration impurity region for the substrate contact within the element region, the element region requires a wider area, obstructing high integration.

It is the primary object of the present invention to provide a method for producing a semiconductor device according to which isolation diffusion and substrate contact diffusion are simultaneously performed so that the number of required steps is reduced.

In order to accomplish the above and other objects, the present invention provides a method for producing a semiconductor device comprising the steps of selectively etching a part of a second conductivity type semiconductor layer formed on a first conductivity type semiconductor substrate where an isolating oxide layer is to be formed; introducing a first conductivity type impurity into a substrate contact forming part extending from the bottom of said etched part, by way of the side surface thereof, to the top surface of said second conductivity type semiconductor layer to form a substrate contact; thermally oxidizing said etched part to form an isolating oxide layer; and forming a semiconductor element in said second conductivity type semiconductor layer.

This invention can be more fully understood from the following detailed description when taken in conjunction with the accompanying drawings, in which.

In a method for producing a semiconductor device of the present invention, for introducing an impurity for isolation diffusion at the bottom of an area where the isolation oxide layer is to be formed, the area is first formed by selectively etching a second conductivity type semiconductor layer formed on a first conductivity type semiconductor substrate. The impurity is then introduced simultaneously into the bottom of the thus formed etched part as well as into a side surface of the second conductivity type semiconductor layer in a region between the top surface thereof and the bottom of said thusly formed etched part, so that a diffusion region having both the function of element isolation and substrate contact may be formed.

According to the method of the present invention, the selective etching of the second conductivity type semiconductor layer is performed in the following manner. An oxidation resisting material layer is covered over the second conductivity type semiconductor layer. The part of the oxidation resisting material layer which corresponds to the isolating oxide layer is removed by photolithography. The remainder of the oxidation resisting material layer is used as a mask to etch the second conductivity type semiconductor layer. As the oxidation resisting material, si3N4 may be used. Such oxidation resisting material may be used as a mask for selective etching as well as a mask for selective forming of an isolating oxide layer.

According to the method of the present invention, the introduction of the first conductivity type impurity is performed by diffusion or ion implantation using, as a mask, a photoresist layer patterned by, for example, photolithography.

According to the method of the present invention, after forming the isolating oxide layer, a first conductivity type diffusion region within the element region adjacent to the isolating oxide layer may be formed so as to be connected with the first conductivity type diffusion region of which the substrate contact has been previously formed. With this construction, when forming the electrode for applying a substrate bias, the electrode and the substrate contact may be connected through the diffusion region of high impurity concentration. As a result, the connection resistance of the substrate then may be made lower. Since the diffusion region to be formed later is formed simultaneously with the formation of the first conductivity type diffusion region formed at the other places of the element region, e.g., the base region of a bipolar transistor, the number of steps for producing a semiconductor device does not increase.

Figure 1A:
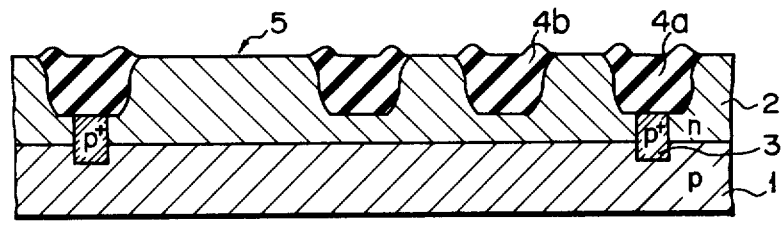
FIGS. 1A and 1B are sectional views illustrating the steps for forming a substrate bias terminal of a semiconductor device according to a conventional method.
Figure 1B:
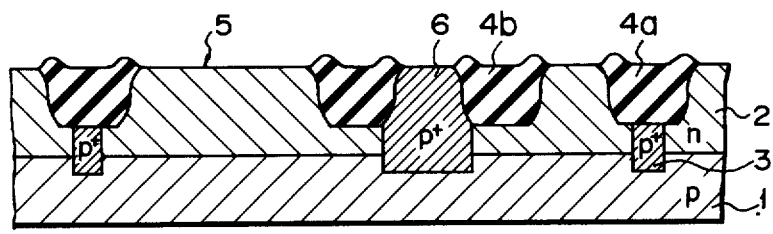
Figure 2A:
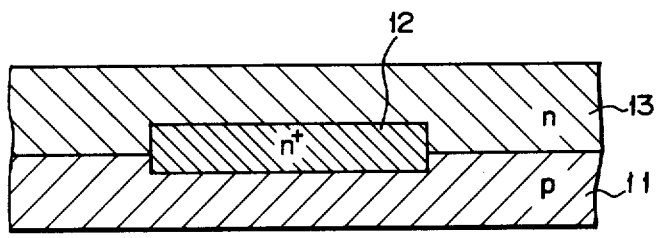
FIGS. 2A to 2G are sectional views illustrating the steps for forming a substrate bias terminal of a bipolar semiconductor device according to an embodiment of the present invention.

The present invention will be described as applied to a bipolar semiconductor device referring to FIGS. 2A to 2G. Example As shown in FIG. 2A, an n+ buried layer 12 was selectively formed on a p-type silicon substrate 11, and an n-type silicon epitaxial layer 13 was also formed on the substrate 11.

Figure 2B:
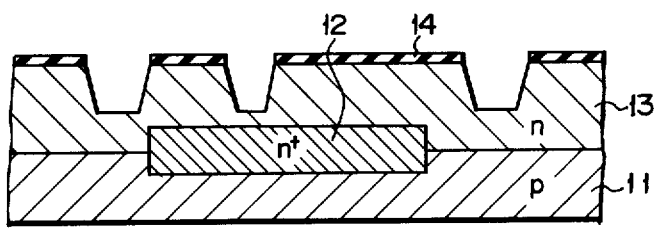

Subsequently, a silicon nitride layer of, for example, 1,000 Å thickness was deposited on the epitaxial layer 13. The parts of the silicon nitride layer which corresponded to where the isolating oxide layer was to be formed were removed by photolithography to form a silicon nitride pattern 14. Thereafter, as shown in FIG. 2B, the epitaxial layer 13 was selectively etched using the silicon nitride pattern 14 as a mask.

Figure 2C:
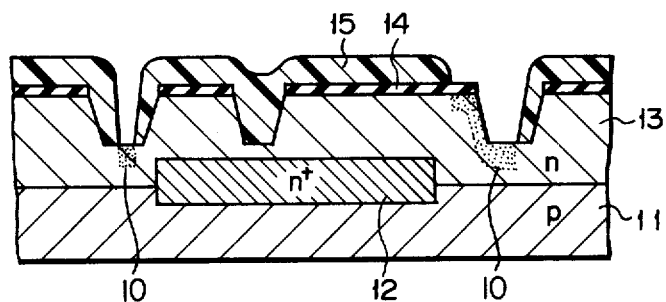

A photoresist was painted on the entire surface of the structure, and a resist pattern 15 was formed by photolithography with the element isolation region and the substrate contact region alone removed. Then, as shown in FIG. 2C, a p-type impurity 10, boron for example, was ion implanted in the n-type epitaxial layer 13 using the resist pattern 15 as a mask at an energy of 230 KeV and a dose of $2 \times 10^5$ cm$^{-2}$.

Figure 2D:
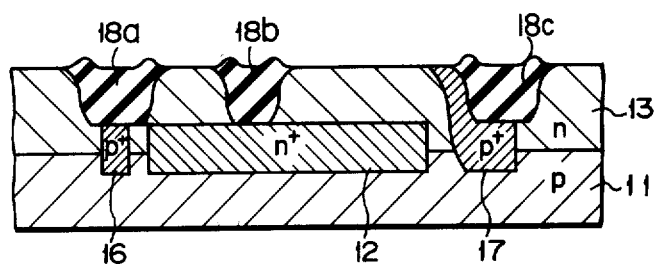

After removing the resist pattern 15, a thermal treatment was performed at 1100° C. Then, thermal oxidation was performed at 1000° C. under a pressure of 9 atm. in a H$_2$-O$_2$ atmosphere, using the silicon nitride pattern 14 as an oxidation resisting mask. The silicon nitride pattern 14 was etched away thereafter. As a result, as shown in FIG. 2D, an isolation region 16 which extends to the substrate 11 and a substrate contact region 17 which also functions as an isolation layer and which extends from the substrate 11 to the surface of the epitaxial layer 13 were formed, isolating oxide layers 18a, 18b, and 18c were formed at the removed parts of the epitaxial layer 13.

Thereafter a photoresist was coated on the entire surface of the structure. The photoresist film was subjected to photolithography, whereby those portions which correspond to collector regions were removed to form a resist pattern. Arsenic As-doped silicate glass was deposited 7000Å thick on the entire surface of the structure. Arsenic in the silicate glass film was thermally diffused into the n-type epitaxial layer 13 through the resist pattern, thus forming a deep n+-type collector region 23.

Figure 2E:
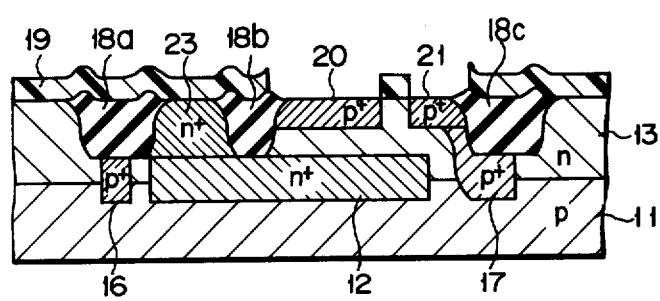

A photoresist was painted on the entire surface of the structure, and a resist pattern 19 was formed in which the parts corresponding to the base region and the substrate contact were removed by photolithography. Then, a p-type impurity, boron for example, was ion implanted at an energy of 120 keV and at a dose of $2 \times 10^{14}$ cm$^{-2}$ using the resist pattern 19 as a mask. Thereafter, the structure was heated to diffuse the p-type impurity. Consequently, as shown in FIG. 2E, a p+-type base region 20 was formed in the epitaxial layer 13, and a p+-type diffusion layer 21 was simultaneously connected with the substrate contact region 17. A substrate bias terminal is thus formed.

Figure 2F:
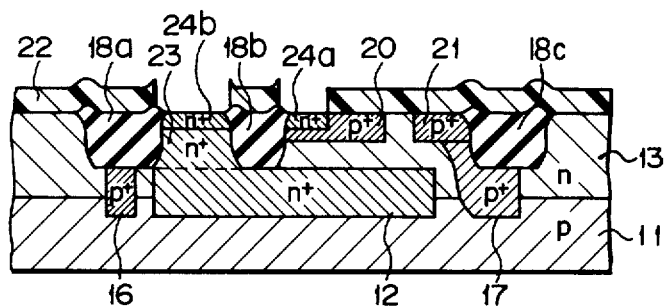
Figure 2G:
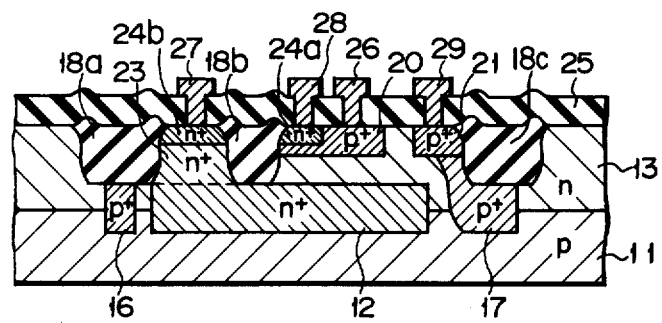
Figure 4:
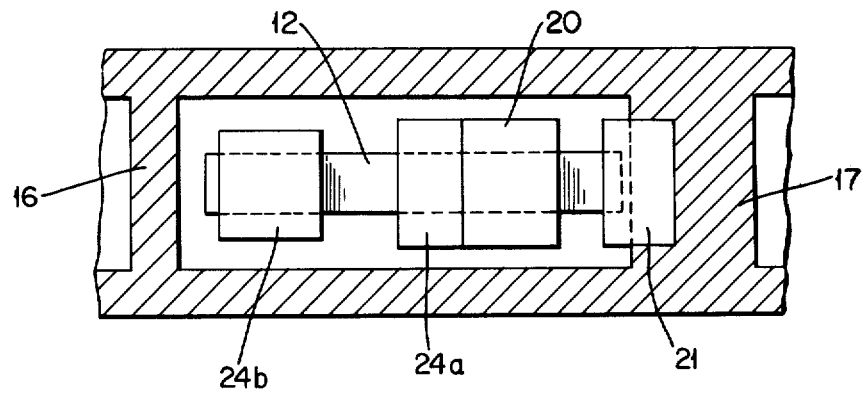
FIG. 4 is a plan view illustrating a bipolar semiconductor device produced according to the present invention and shown in FIG. 2G.
Figure 5:
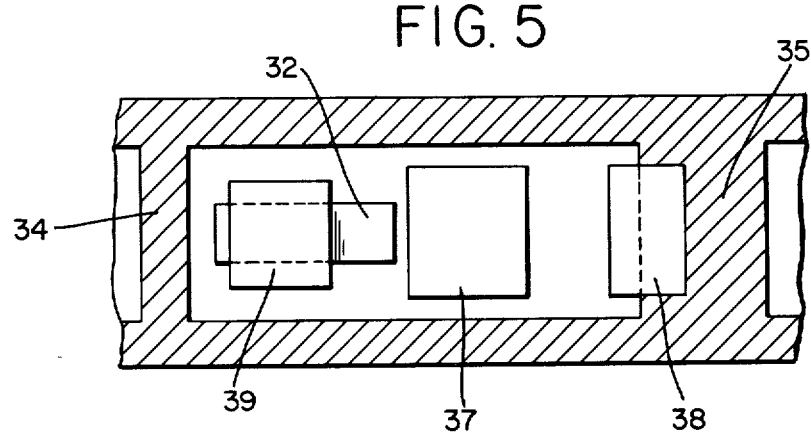
FIG. 5 is a plan view illustrating a p-n-p transistor produced according to the present invention and shown in FIG. 3.

The resist pattern 19 was removed and a photoresist was painted on the surface. A resist pattern 22 was formed in which the parts corresponding to the collector region and the emitter region are removed by photolithography. Thereafter, an n-type impurity, arsenic for example, was ion implanted at an energy of 60 KeV and at a dose of $1 \times 10^{16}$ cm$^{-2}$ using the resist pattern 22 as a mask. As a result, as shown in FIG. 2F and FIG. 4, an n+-type collector region 24b was formed in the epitaxial layer 13 isolated by the isolating oxide layers 18a and 18b, and an n+-type emitter region 24a was formed in the base region 20.

The resist pattern 22 was then removed. An SiO$_2$ layer 25 of 5000Å thickness was deposited on the entire surface of the structure by the CVD (chemical vapor deposition) method. The parts of the SiO$_2$ layer which cover the base region 20, the collector region 23, the emitter region 24a and the p+-type diffusion region 21 as the substrate bias terminal were removed to form contact holes. An aluminum layer of 1 μm thickness was covered over the entire surface and was patterned to form a base electrode 26, a collector electrode 27, an emitter electrode 28, and an electrode 29 for the substrate bias terminal. A bipolar semiconductor device as shown in cross section in FIG. 2G and in plan in FIG. 4 was thus produced.

Figure 3:
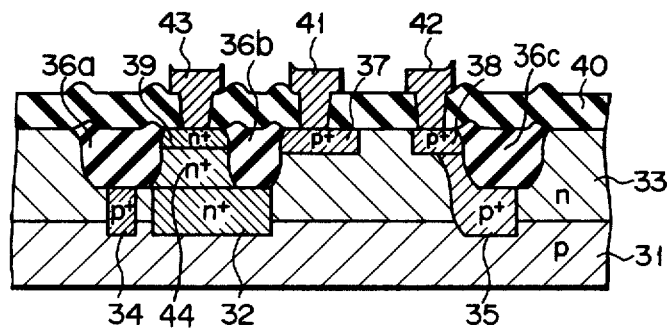
FIG. 3 is a sectional view illustrating a substrate pnp transistor produced according to another embodiment of the present invention.

The method of the present invention is not limited to the production of the bipolar semiconductor device of the above example. For example, the method of the present invention is similarly applicable to the production of a substrate pnp transistor wherein the substrate is used as a common collector. The method of the present invention will now be described, with reference to FIG. 3, as applied to a substrate pnp transistor.

After forming an n+-type buried layer 32 and an n-type epitaxial layer 33 on a p-type silicon substrate 31, the parts of epitaxial layer 33 where the isolating oxide layer is to be formed were selectively etched. A p+-type impurity, boron for example, was ion implanted to form a p+-type isolation region 34 and a p+-type impurity region 35 functioning bath as a p-n isolation region and a substrate contact. After forming isolating oxide layers 36a, 36b, and 36c by selective oxidation, arsenic in a silicate glass film was thermally diffused into the n-type epitaxial layer 33 through a suitable resist pattern to form a deep n+-type base region 44. Then a p+-type impurity, boron for example, was ion implanted to simultaneously form an emitter region 37; a p+-type impurity region 38 as a collector terminal connected to p+-type impurity region 35 which functions in addition as a substrate contact region. Thereafter, an n+-type impurity, arsenic for example, was diffused in the epitaxial layer 33 isolated by the isolating oxide layers 36a and 36b to form an n+-type base region 39. After depositing an SiO$_2$ layer 40 by the CVD method, contact holes for the emitter, the collector and the base were formed. An aluminum layer was formed on the entire surface of the structure and was patterned to form an emitter electrode 41, a collector electrode 42, and a base electrode 43. Thus, a substrate pnp transistor as shown in cross section in FIG. 3 and in plan in FIG. 4 was produced.

In summary, in accordance with the present invention, an impurity region having both functions of element isolation and providing a substrate bias terminal may be formed, and the substrate contact may be formed at any part of the element region adjacent to the isolating oxide layer. Thus, the number of steps is reduced as compared with the conventional method, and the production of a semiconductor device with extremely improved packaging density is enabled.

What is claimed is:

1. A method for producing a semiconductor device comprising the steps of selectively etching a part of a second conductivity type semiconductor layer formed on a first conductivity type semiconductor substrate where an isolating oxide layer is to be formed; introducing a first conductivity type impurity into a substrate contact forming part extending from the bottom of said etched part, by way of the side surface thereof, to the top surface of said second conductivity type semiconductor layer to form a substrate contact; thermally oxidizing said etched part to form an isolating oxide layer; and forming a semiconductor element in said second conductivity type semiconductor layer.

2. A method as claimed in claim 1, wherein said step of selectively etching away the part of said second conductivity type semiconductor layer where the isolating oxide layer is to be formed comprises covering said second conductivity type semiconductor layer with an oxidation resisting material layer, selectively etching away the part of said oxidation resisting material layer corresponding to said isolating oxide layer, and etching away said second conductivity type semiconductor layer using the remaining oxidation resisting material layer as a mask.

3. A method as claimed in claim 1 or 2, wherein a part of said second conductivity type semiconductor layer which corresponds to an element isolation region is also etched by said etching step, and said first conductivity type impurity is selectively introduced also in an area reaching from the thus formed etched part to form the element isolation region.

4. A method as claimed in claim 2, wherein said oxidation resisting material is silicon nitride.

5. A method as claimed in claim 4, wherein the introduction of said first conductivity type impurity is performed by ion implantation.

6. A method as claimed in claim 1 or 2, further comprising the step of forming a first conductivity type impurity region to connect with said substrate contact in an area adjacent to said isolating oxide layer after forming said isolating oxide layer.

7. A method as claimed in claim 1, wherein said semiconductor device is a bipolar semiconductor device.

8. A method as claimed in claim 7, wherein said semiconductor device is a substrate pnp transistor in which the substrate contact acts as a collector terminal.

* * * * *